(12) United States Patent
Hashempour et al.

(10) Patent No.: US 11,226,649 B2
(45) Date of Patent: Jan. 18, 2022

(54) CLOCK DELAY CIRCUIT

(71) Applicant: NXP B.V., Eindhoven (NL)

(72) Inventors: Hamidreza Hashempour, Eindhoven (NL); Jos Verlinden, Wachtendonk (DE); Ids Christiaan Keekstra, Nieuw-Amsterdam (NL)

(73) Assignee: NXP B.V., Eindhoven (NL)

( * ) Notice: Subject to any disclaimer, the term of this patent is extended or adjusted under 35 U.S.C. 154(b) by 426 days.

(21) Appl. No.: 15/867,943

(22) Filed: Jan. 11, 2018

(65) Prior Publication Data
US 2019/0212770 A1  Jul. 11, 2019

(51) Int. Cl.
*G06F 1/12* (2006.01)
*H03K 5/26* (2006.01)
*H03K 3/037* (2006.01)
*H03K 3/017* (2006.01)
*H03K 5/13* (2014.01)
*H03K 5/00* (2006.01)

(52) U.S. Cl.
CPC ............... *G06F 1/12* (2013.01); *H03K 3/017* (2013.01); *H03K 3/037* (2013.01); *H03K 5/13* (2013.01); *H03K 5/26* (2013.01); *H03K 2005/00019* (2013.01)

(58) Field of Classification Search
CPC . G06F 1/12; H03K 3/037; H03K 5/26; H03K 5/22; H03K 2005/00019; H03K 2005/00071; H03K 2005/00058
See application file for complete search history.

(56) References Cited

U.S. PATENT DOCUMENTS

| | | |
|---|---|---|
| 5,006,725 A | 4/1991 | Nawaki |
| 6,339,349 B1 | 1/2002 | Rajagopalan |
| 6,424,178 B1 | 7/2002 | Harrison |
| 6,831,493 B2 | 12/2004 | Ma |
| 6,992,517 B2 | 1/2006 | Weiner |
| 7,456,664 B2 | 11/2008 | Jacobsson et al. |
| 7,911,873 B1 | 3/2011 | Menon et al. |
| 8,294,502 B2 * | 10/2012 | Lewis ............ H03K 5/13 327/261 |
| 8,384,462 B2 | 2/2013 | Takatori |
| 8,564,345 B2 | 10/2013 | Yu |
| 8,754,690 B2 | 6/2014 | Thiagarajan et al. |
| 8,907,711 B2 * | 12/2014 | Kawagoe ......... H03L 7/00 326/93 |
| 9,337,819 B2 | 5/2016 | Granhaug et al. |
| 9,379,690 B2 | 6/2016 | Humphrey et al. |
| 2010/0259308 A1 | 10/2010 | Wang et al. |
| 2012/0212265 A1 | 8/2012 | Quan et al. |
| 2013/0049832 A1 | 2/2013 | Wong |

* cited by examiner

*Primary Examiner* — Jung Kim
(74) *Attorney, Agent, or Firm* — David G. Dolezal

(57) ABSTRACT

A clock delay circuit includes an output to provide an output clock signal which is a delayed version of an input clock signal. The clock delay circuit includes a latch whose output provides the output clock signal. A delay control circuit provides a third clock signal. The latch includes a first input to receive the input clock signal and a second input to receive the third clock signal. The amount of delay provided by the latch is dependent upon the duty cycle of the third clock signal.

21 Claims, 6 Drawing Sheets

CLOCK DELAY CIRCUIT

BACKGROUND OF THE INVENTION

Field of the Invention

This invention relates in general to clock delay circuits.

Description of the Related Art

Clock circuits are used by electronic systems for providing clock signals or other alternating signals at a particular frequency. Some systems utilize clock delay circuits for providing delayed versions of a clock signal e.g. for system synchronization.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

A clock delay circuit includes an output to provide an output clock signal which is a delayed version of an input clock signal. The clock delay circuit includes a latch whose output provides the output clock signal. A delay control circuit provides a third clock signal. The latch includes a first input to receive the input clock signal and a second input to receive the third clock signal. The amount of delay provided by the latch is dependent upon the duty cycle of the third clock signal.

With some prior art delay clock circuits, delay is introduced to an input clock signal by passing the clock signal through one or more delay elements. One issue with such circuits is that the delay provided by the delay elements may vary with respect to process, frequency, voltage, and/or temperature, thereby affecting the accuracy of the clock delay circuit across a desired operating range.

With embodiments described herein, a delay is provided by clocking the input clock signal with a latch to provide a delayed version of the input clock signal. Accordingly, such a circuit is less sensitive to process, frequency, voltage, and/or temperature variation of a desired operating range.

Figure 1:
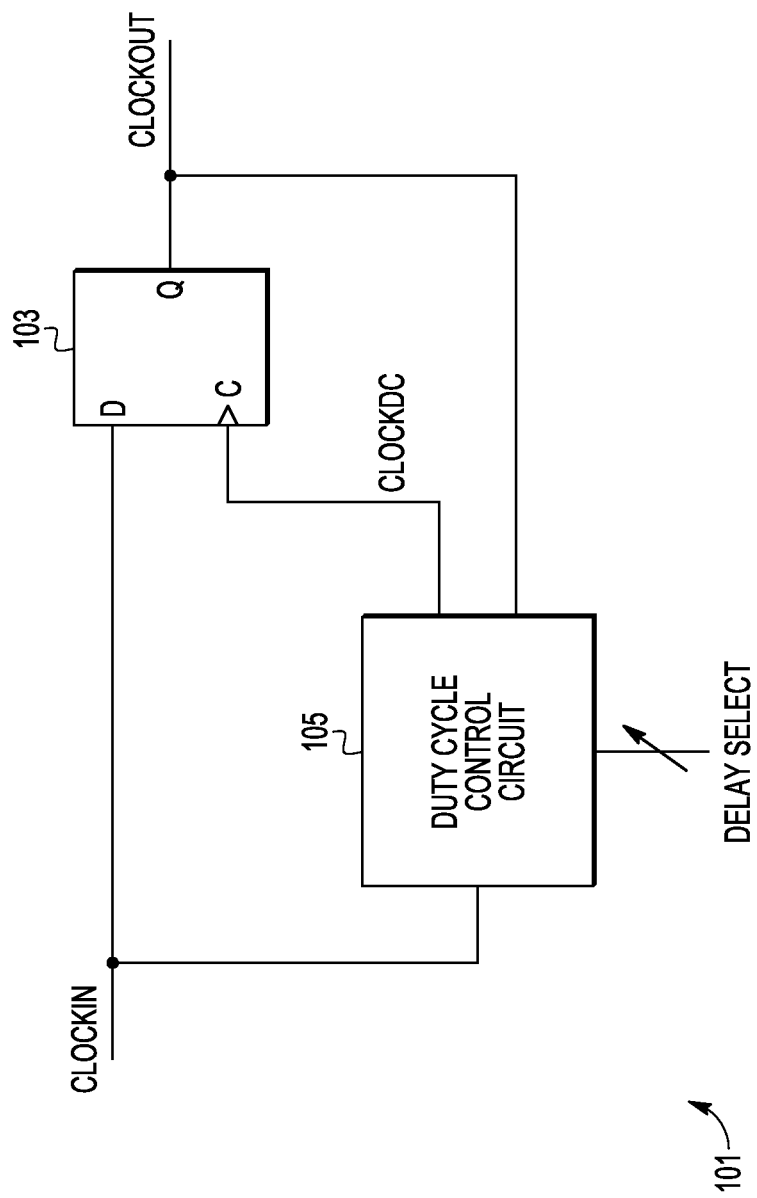
FIG. 1 is a circuit diagram of a clock delay circuit according to one embodiment of the present invention.

FIG. 1 is a circuit diagram of a clock delay circuit according to one embodiment of the present invention.

Delay circuit 101 includes a clock input that receives an input clock signal (CLOCKIN) and provides a delayed version of the input clock signal (CLOCKOUT) at its output. The input clock signal is provided to the data input of a flip-flop 103 whose output provides the output clock signal. In the embodiment shown, flip-flop 103 is a rising edge, D flip-flop, but other types of latches (e.g. a J-K flip-flop, J-K latch, S-R flip-flop, S-R latch, falling edge D flip-flop, other types of flip-flops) may be used in other embodiments.

The clock input of flip-flop 103 receives a clocking signal (CLOCKDC) from a duty cycle control circuit 105. Delay control circuit 105 receives the input clock signal (CLOCKIN), the output clock signal (CLOCKOUT), and a select signal (DELAY SELECT), which is used to select the desired delay. The amount of delay provided by flip-flop 103 is dependent upon the duty cycle of the clocking signal from circuit 105. In the embodiment shown, the select signal is a multibit, parallel signal that provides an indication of the amount of delay desired. In one embodiment, the delay circuit can provide an adjustable delay of 0 to 180 degrees delay with increments of 0.25 degrees of delay. However, other embodiments may have other delay ranges and/or be adjustable by other increments. In one embodiment, the input clock signal has a frequency in the range of 1 KHZ to 1 GHZ (depending upon the circuit design) but may be at other frequencies in other embodiments.

Delay circuit 101 can be implemented in a number of different circuits for providing a controlled delay for a clocking signal. Examples of such circuits include bus controllers (e.g. an Ethernet controller), logic, buffers, memories, processors, and microcontrollers. Such a delay circuit can be used in systems such as a computer system, smart phone, microcontroller, appliance, industrial controller, or automobile control system. In some embodiments, embodiments of a delay clock circuit can be utilized to meet an accuracy requirement of +1.2% of the input clock frequency or +1.2% of the input clock period.

Figure 2:
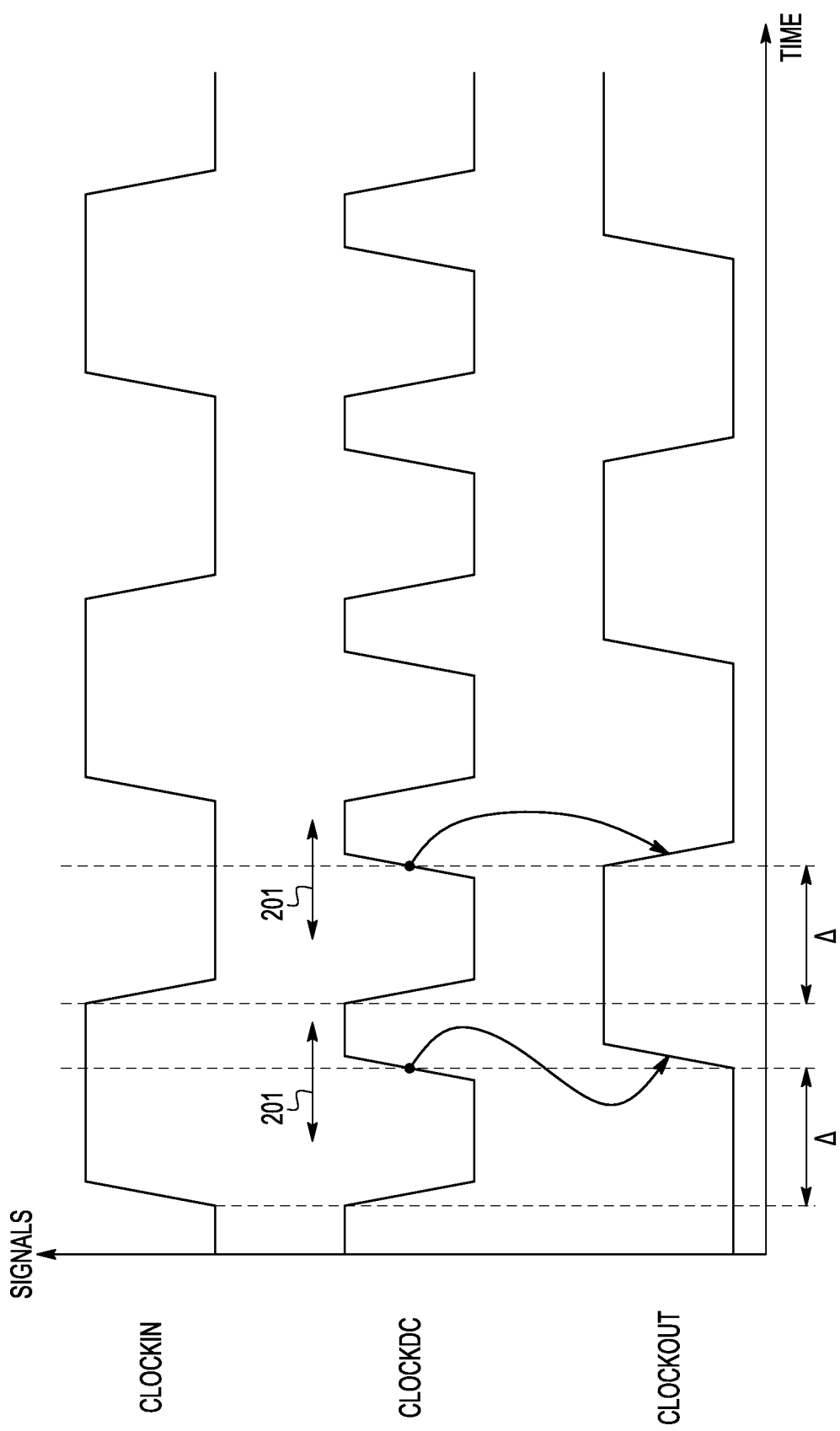
FIG. 2 is a timing diagram according to one embodiment of the present invention.

FIG. 2 shows a timing diagram of circuit 101 in providing a delay to an output clock signal (CLOCKOUT). In the embodiment shown, the clocking signal (CLOCKDC) has a falling edge that aligns with the rising and falling edges of the input clock signal (CLOCKIN). At each rising edge of the clocking signal (CLOCKDC), flip-flop 103 latches at its output, the present clock state of the input of flip-flop 103. The occurrence of a subsequent rising edge from a previous falling edge of the clocking signal is adjustable (see arrow 201) by increasing or decreasing the duty cycle of the clocking signal. In the embodiment shown, increasing the duty cycle of the clocking signal (CLOCKDC) shortens the time in which the subsequent rising edge of the clocking signal occurs and accordingly when the state of the input clock signal is latched at the output of flip-flop 103, thereby decreasing the delay time (Δ). Decreasing the duty cycle of the clocking signal (CLOCKDC) increases the time in which the subsequent rising edge of the clocking signal occurs and accordingly the state of the input clock is latched at the output of flip-flop 103, thereby increasing the delay time (Δ).

Figure 3:
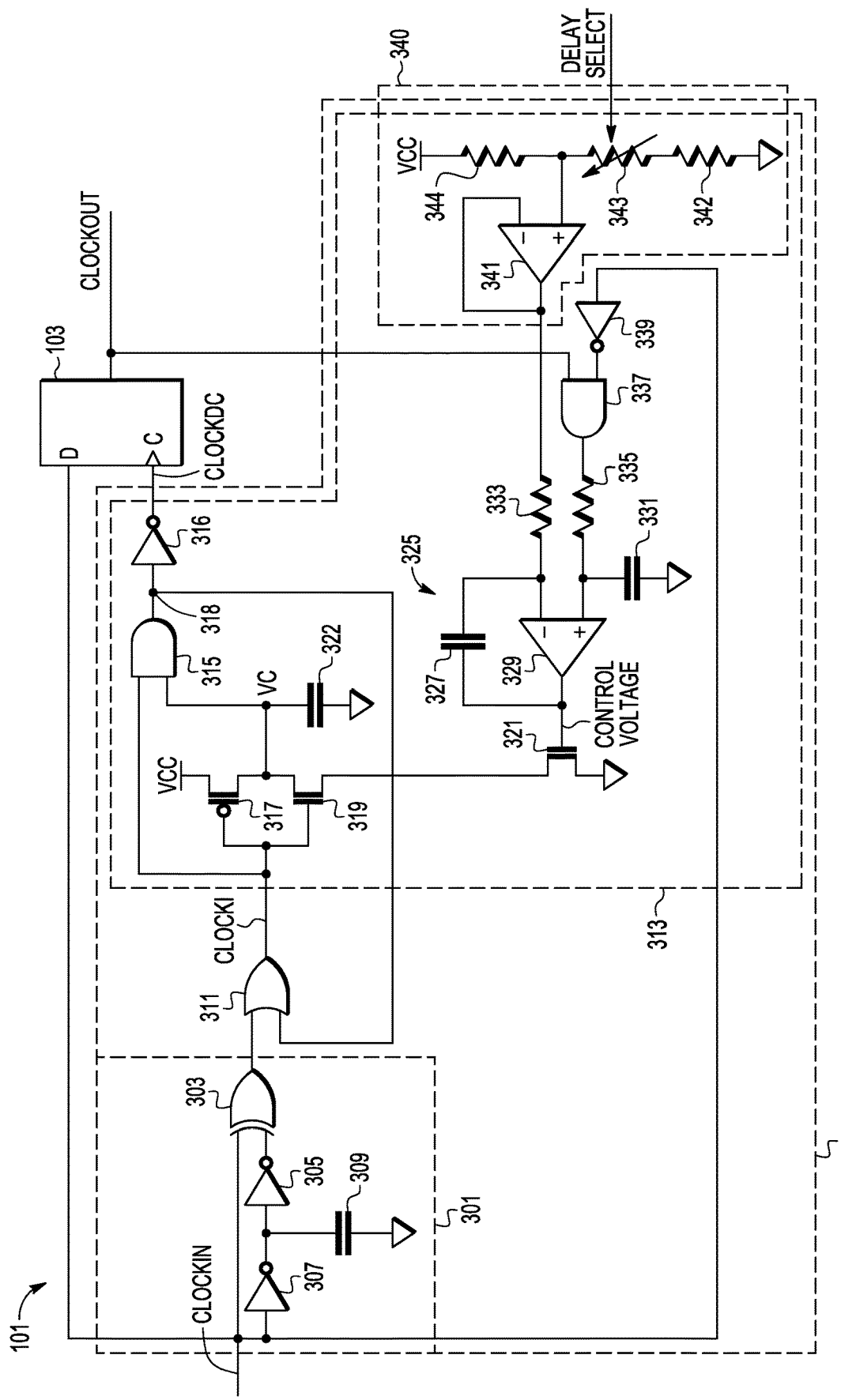
FIG. 3 is a circuit diagram of a clock delay circuit according to one embodiment of the present invention.

FIG. 3 is a more detailed circuit diagram of one embodiment of clock delay circuit 101. Delay control circuit 105 includes a dual edge detector circuit 301, a pulse extender circuit implemented by OR gate 311, and a duty cycle adjust circuit 313. Dual edge detector circuit 301 includes an XOR logic gate 303, inverters 307 and 305, and capacitor 309. Circuit 301 provides at its output, pulses of a finite duration at both the rising edges and the falling edges of the input clock signal (CLOCKIN). Inverters 307, 305, and capacitor 309 form a delay path for one input of the XOR gate 303 that generates a timing difference with the input clock signal at each rising edge and falling edge of the input clock signal to generate a pulse at the output of XOR gate 303. The duration of the pulse is dependent on the delay provided by the two inverters 307 and 305 and on the size of capacitor 309. In other embodiments, the delay may be provided by other types of delay circuitry. In one embodiment, the duration of the pulses of circuit 301 is in the range of 0.1 to 0.5 nanoseconds, but may be of different durations in other embodiments. To lengthen the pulses of circuit 301, OR gate 311 performs a logical OR function of the output of circuit 301 with a signal from node 318 of duty cycle adjust circuit 313 to generate an intermediate clock signal (CLOCKI) having a frequency that is double of the input clock signal and having pulses occurring at the beginning of the rising edges and falling edges of the input clock signal. In some embodiments, OR gate 311 is not needed where the pulses of the output of circuit 301 are of a sufficient duration. Utilizing a dual edge detector circuit 301 that provides pulses on both the rising edges and falling edges enables a clock delay circuit to include only one duty cycle adjust circuit 313 for both the rising edges and the falling edges. Not only does this save integrated circuit space, but it may provide for better accuracy in that device mismatch can be avoided as with an embodiment (see FIG. 5) that includes a duty cycle adjust circuit for both the rising edges (circuit 501) and the falling edges (circuit 503) of the input clock signal. The dual edge detector circuit 301 and pulse extender may have other configurations in other embodiments.

Duty cycle adjust circuit 313 includes circuitry for adjusting the duty cycle of the clocking signal (CLOCKDC) to provide the desired delay between the input clock signal (CLOCKIN) and the output clock signal (CLOCKOUT). Circuit 313 includes an input to receive a select signal (DELAY SELECT) whose value is indicative of the desired delay. Circuit 313 includes a resistive digital-to-analog converter (RDAC) circuit 340 that includes a variable resistor circuit 343 whose resistance is adjustable to provide a DC voltage to the non-inverting input of amplifier 341 whose value is indicative of the desired delay. Circuit 340 also includes resistors 344 and 342 in series with variable resistor circuit 343. In other embodiments, other types of digital to voltage converters may be used in place of RDAC circuit 340 such as a capacitor digital-to-analog converter circuit in order to reduce power. In another embodiment, the select signal (DELAY SELECT) may be an analog signal. In the embodiment shown, circuit 340 includes a buffer circuit implemented with amplifier 341 for reducing the current draw of circuit 340 and to prevent current draw variation from changing the RDAC set points.

Circuit 313 includes an AND gate 337, inverter 339, and an RC filter that includes resistor 335 and capacitor 331 for providing a DC voltage at the non-inverting input of amplifier 329 that is indicative of the delay between the output clock signal and the input clock signal. AND gate 337 and inverter 339 form a pulse generator circuit whose output is a pulse signal indicative of a delay difference between the input clock signal and the output clock signal. AND gate 337 combines the output clock signal with the inverted input clock signal to generate a pulse signal that is low pass filtered by resistor 335 and capacitor 331 into a DC voltage. The inverting input of amplifier 329 is coupled to the output of buffer 341 through resistor 333 to receive the voltage indicative of the desired delay as indicated by the select signal (DELAY SELECT). Amplifier 329 functions as an error amplifier for adjusting its output (CONTROL VOLTAGE) based on the difference between the measured delay (as indicated by the voltage at its non-inverting input) and the desired delay (as indicated by the voltage at its inverting input) in order to adjust the measured duty cycle to match the desired duty cycle. Circuit 313 includes integration capacitor 327 for providing feedback loop stability.

Circuit 313 includes an inverter with a P-type transistor 317, an N-type transistor 319, and an N-type transistor 321 coupled in series. In the embodiment shown, transistors 317, 319, and 321 are configured as a "current starved inverter" where the conductivity of transistor 321 can be controlled by the CONTROL VOLTAGE signal to control the strength of the discharge path from node VC to ground for discharging capacitor 322. Circuit 313 includes an AND gate 315 and a capacitor 322, which is coupled to one of the inputs of AND gate 315. The output of OR gate 311 is coupled to the other input of AND gate 315.

Figure 4:
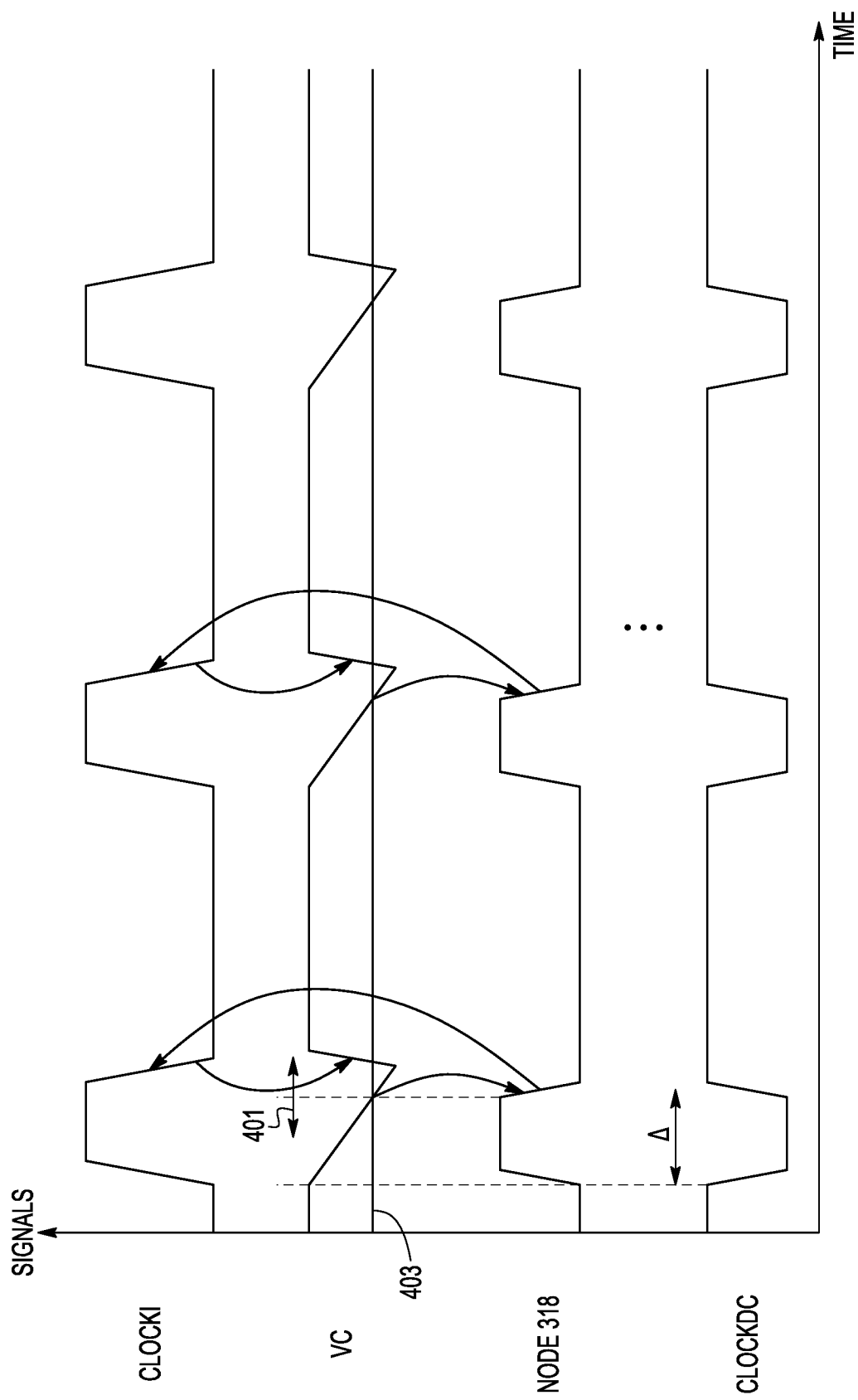
FIG. 4 is a timing diagram according to one embodiment of the present invention.

FIG. 4 shows a timing diagram of duty cycle adjust circuit 313 in producing the clocking signal (CLOCKDC). In the embodiment shown, circuit 313 controls the duty cycle of the clocking signal by controlling the discharge rate of capacitor 322. Circuit 313 controls the discharge rate by controlling the conductivity of transistor 321 based on the comparison of the desired delay (as determined by the SELECT SIGNAL) with respect to the measured delay (as indicated by the voltage (CONTROL VOLTAGE) at the non-inverting input of amplifier 329).

In FIG. 4, the intermediate clock signal (CLOCKI) is a clock signal that is twice the frequency of the input clock signal. When the intermediate clock signal transitions from a high state to a low state, transistor 317 becomes conductive to pull the voltage of node VC to a high voltage relatively quickly. Because node VC is connected to one input of AND gate 315 and the intermediate clock signal is provided to the other input of AND gate 315, the falling clock edge of the intermediate clock signal and the rising edge of node VC do not cause the output of AND gate 315 (node 318) to rise at this time.

The voltage of node VC begins to fall when the intermediate clock signal (CLOCKI) transitions to a high voltage. However, the voltage of node VC does not immediately fall below the trip voltage 403 of AND gate 315 in that the charge on capacitor 322 holds the voltage of node VC above the trip voltage 403 until capacitor 322 is sufficiently discharged through transistor 319 and transistor 321. The rate of discharge of capacitor 322 is controlled by the conductivity of transistor 321. Because the conductivity of transistor 321 is controlled by the CONTROL VOLTAGE signal, the amount of time needed to discharge capacitor 322 below the trip point voltage 403 is adjustable (see arrow 401) by adjusting the CONTROL VOLTAGE signal, which can be adjusted by changing the SELECT signal.

When the voltage of node VC drops below the trip voltage 403, the output of AND gate 315 (node 318) falls. The longer it takes the voltage of node VC to fall below the trip voltage 403, the larger the duty cycle of the pulse at node 318. Because the clocking signal (CLOCKDC) is inverted from node 318, the longer it takes the voltage of Node VC to fall below trip voltage 403, the shorter the duty cycle of the clocking signal (CLOCKDC) and the longer the delay (Δ) of the output clock to the input clock. Accordingly, for the embodiment shown, raising the voltage of the CONTROL VOLTAGE signal makes capacitor 322 discharge faster which makes the voltage at node VC fall faster and thus increases the duty cycle of the clocking signal to shorten the delay(Δ). Conversely lowering the voltage of the CONTROL VOLTAGE signal makes capacitor 322 discharge slower which makes the voltage at node VC fall slower and thus decrease the duty cycle of the clocking signal to lengthen the delay(Δ).

In the embodiment shown, the voltage of node 318 transitioning to a low state causes the voltage of the intermediate clock signal (CLOCKI) to transition to a low state (assuming that the pulse of circuit 301 is relatively shorter). As stated above, the intermediate clock signal transitioning from a high state to a low state causes transistor 317 to become conductive to pull the voltage of node VC to a high voltage relatively quickly.

Circuit 105 may have other configurations in other embodiments. For example, a NAND gate (not shown) may replace AND gate 315 and inverter 316. With such an embodiment, an inverter (not shown) would be located in the feedback path from node 318 to the input of OR gate 311. With either embodiment, both an AND gate 315 or a NAND gate (not shown) would perform an ANDing function of the intermediate clock signal (CLOCKI) and node VC.

As used herein, the term "charging state rate" of a capacitor can refer to either the charge rate of a capacitor or the discharge rate of a capacitor. In the embodiment of FIG. 3, the charging state rate of capacitor 322 being controlled to adjust the duty cycle of the clocking signal is the discharge rate of capacitor 322. In other embodiments (not shown), the charging state rate of capacitor 322 being controlled to adjust the duty cycle is the charge rate of capacitor 322. In one example of an embodiment where the charge rate of a capacitor is being controlled to control the duty cycle of a clocking signal (CLOCKDC), the CONTROL VOLTAGE signal would be provided to an extra P-type transistor (not shown) in series with transistor 317. In such an embodiment, the voltage of node VC as well as the CONTROL VOLTAGE signal would be referenced to VCC instead of ground. In other embodiments, both the charge rate and the discharge rate of a capacitor would be controlled to control the duty cycle.

Figure 5:
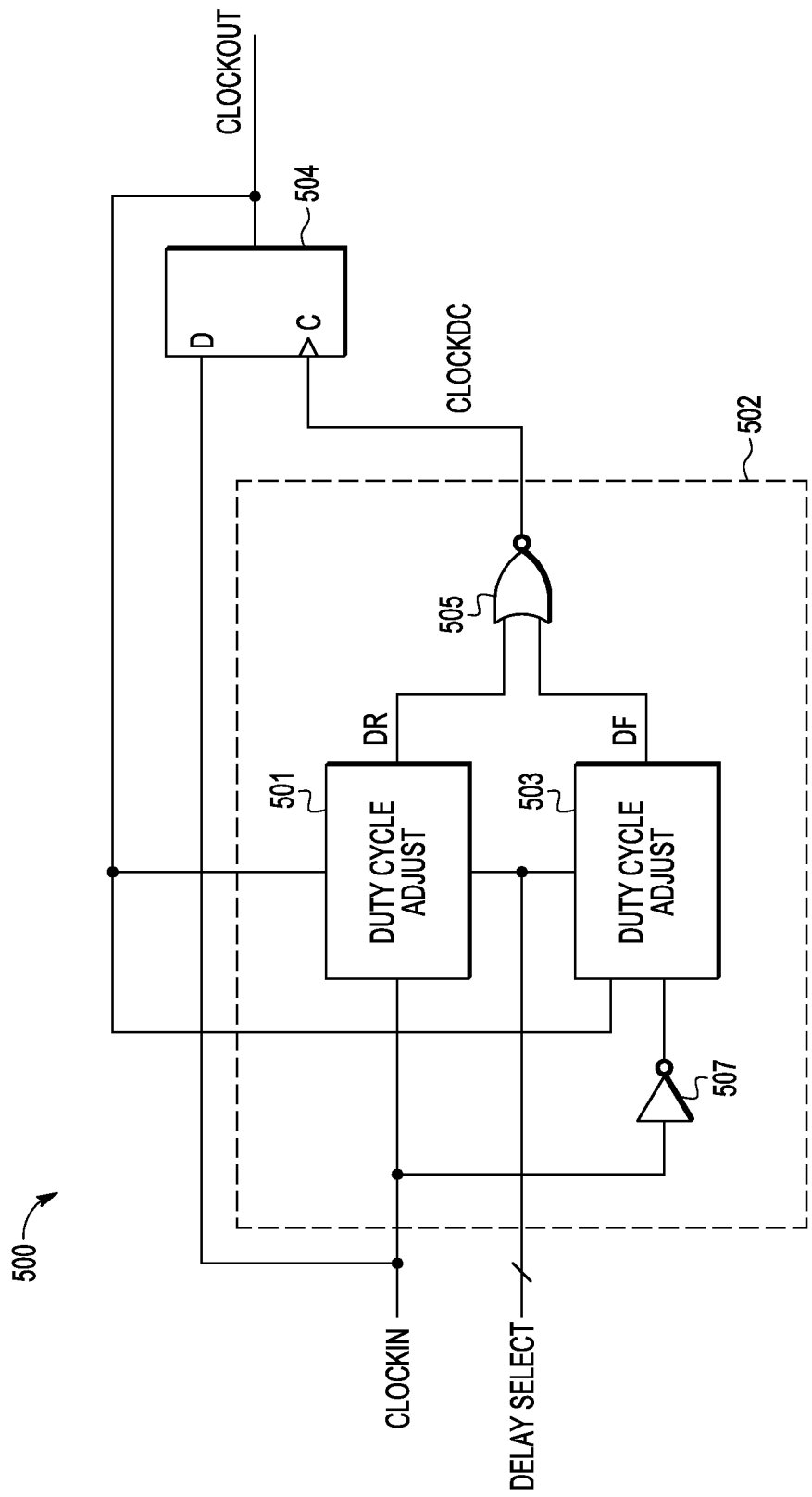
FIG. 5 is a circuit diagram of a clock delay circuit according to another embodiment of the present invention.

FIG. 5 is a circuit diagram of a clock delay circuit 500 according to another embodiment of the present invention. Clock delay circuit 500 includes a D type flip-flop 504 and a delay control circuit 502. The clocking signal (CLOCKDC) produced by circuit 502 is used to control the delay provided by D flip-flop 504 in a similar manner as described with respect to FIG. 1. With the embodiment of FIG. 5, the delay control circuit 502 includes two duty cycle adjust circuits 501 and 503 that are similar to duty cycle adjust circuit 313 except that inverter 316 is omitted. Instead of receiving an intermediate clock signal (CLOCKI) at the input of the current starved inverter of transistors 317, 319, and 321 (see FIG. 3), the input clock signal is provided to the input of the current starved inverter (not shown) of duty cycle adjust circuit 501 and an inverted input clock signal is provided via inverter 507 to the input of the current starved invertor (not shown) of duty cycle adjust circuit 503.

Figure 6:
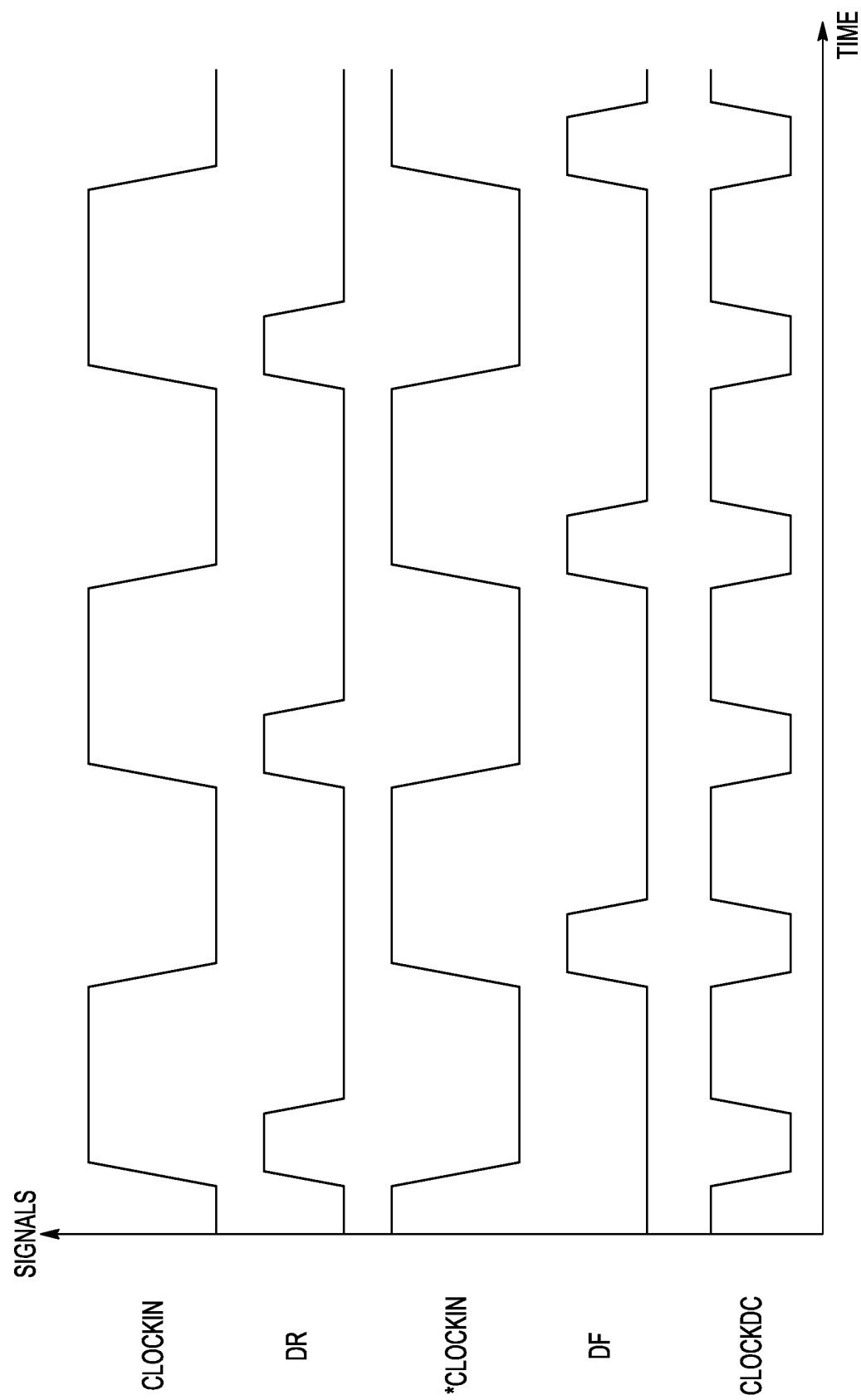
FIG. 6 is a timing diagram according to another embodiment of the present invention.

FIG. 6 shows a timing diagram of the operation of delay control circuit 502. Duty cycle adjust circuit 501 produces an output signal (DR) with pulses having an adjustable duty cycle for the rising edges of the input clock signal and duty cycle adjust circuit 503 produces an output signal (DF) with pulses having an adjustable duty cycle for the falling edges of the input clock signal. NOR gate 505 combines the DR and DF signal and inverts the pulses to produce the clocking signal (CLOCKDC), which is twice the frequency of the input clock signal.

In some embodiments, the AND gate corresponding to gate 315 in circuits 501 and 503 may be replaced with a NAND gate and NOR gate 505 would be replaced with an AND gate (not shown).

Referring back to the embodiment of FIG. 3, a voltage indicative of the measured delay between the input clock signal and the output clock signal is compared (by amplifier 329) with a voltage indicative of the desired delay (as determined by the SELECT SIGNAL) to produce the CONTROL VOLTAGE signal for controlling the duty cycle of the clocking signal (CLOCKDC). In an alternative embodiment, a voltage indicative of the actual duty cycle of the clocking signal (CLOCKDC) would be compared to the voltage indicative of the desired delay to generate the CONTROL VOLTAGE signal. In the alternative embodiment, the clocking signal (CLOCKDC) would be provided to resistor 335 and filtered by resistor 335 and capacitor 331 to generate a voltage indicative of the actual duty cycle of the clocking signal. Amplifier 329 would compare this voltage to the voltage at its inverting input that represents the desired delay as set by the select signal.

In another embodiment, a clock delay circuit may include two circuits each with a current starved inverter of transistors 317, 319, and 321, capacitor 322, and AND gate 315. One of the circuits would receive the input clock signal and the other would receive the inverse of the input clock signal (just as with the embodiment of FIG. 5). Also, as with the embodiment of FIG. 5, the output of each of the AND gates 315 for both circuits would be provided to a NOR gate 505 to provide the clocking signal (CLOCKDC). Unlike the embodiment of FIG. 5, the clock delay circuit would include only one circuit for generating the CONTROL VOLTAGE signal (e.g. RDAC 340, resistors 333 and 335, capacitor 331, capacitor 327, AND gate 337, and amplifier 329) wherein the CONTROL VOLTAGE signal would control the conductivity of the transistors 321 for both circuits.

In some embodiments, providing a clock delay circuit that includes a latch having an input to receive a clocking signal whose duty cycle controls the delay provided by the latch may provide for a more accurate clock delay circuit across a range of temperatures, voltages, frequencies, and accounting for variations in fabrication processes. For example, in some embodiments, the clock delay circuit may provide for an accuracy within 1.2% of the input clock time period over a supply voltage range of 1.08 to 1.32 V and over a temperature range of −40° C. to 135° C. Furthermore, providing feedback in the delay control circuit of the measured delay or of the measured duty cycle of the clocking signal may provide for a more accurate clock delay circuit across varying voltage, frequency temperature, or process conditions.

Features shown or described with respect to one embodiment may be implemented with other embodiments shown or described.

In one embodiment, a clock delay circuit includes an output to provide an output clock signal which is a delayed version of an input clock signal and a delay control circuit including an output for providing a third clock signal having a duty cycle. The clock delay circuit includes a latch including a first input to receive the input clock signal, a second input to receive the third clock signal, and an output to provide the output clock signal, wherein a delay between the input clock signal and the output clock signal is dependent upon the duty cycle of the third clock signal.

In another embodiment, a method for delaying a clock signal includes generating a control signal based on a desired delay between an input clock signal and an output clock signal, controlling a charging state rate of a capacitor with the control signal, and generating a third clock signal. A duty cycle of the third clock signal is dependent on the charging state rate of the capacitor. The method includes providing the third clock signal to a first input of a latch and the input clock signal to a second input of a latch. An output of the latch provides the output clock signal, wherein a delay between the input clock signal and the output clock signal is dependent upon the duty cycle of the third clock signal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A clock delay circuit comprising:
   an output to provide an output clock signal which is a delayed version of an input clock signal;
   a delay control circuit including an output for providing a third clock signal having a duty cycle;
   a latch including a first input to receive the input clock signal, a second input to receive the third clock signal, and an output to provide the output clock signal, wherein a delay between the input clock signal and the output clock signal is dependent upon the duty cycle of the third clock signal.

2. A circuit of claim 1, wherein the delay control circuit comprises:
   a capacitor;
   a charging state rate control circuit, the charging state rate control circuit controls a charging state rate of the capacitor, the duty cycle of the third clock signal is dependent upon a charging state rate of the capacitor.

3. A circuit of claim 2 wherein the charging state rate control circuit includes a comparison circuit including a first input to receive a signal indicative of a desired delay between the input clock signal and the output clock signal and a second input to receive a signal indicative of a measured delay between the input clock signal and the output clock signal, wherein the output of the charging state rate control circuit adjusts the charging state rate of the capacitor based on a comparison by the comparison circuit of the first input of the comparison circuit and the second input of the comparison circuit.

4. The circuit of claim 2 wherein the delay control circuit further comprises a first circuit having a first input to receive a clock signal and a second input coupled to the capacitor, an output of the first circuit provides the third clock signal.

5. The circuit of claim 4 wherein the first circuit performs at least a logical AND function of the first input and the second input of the first circuit.

6. The circuit of claim 2 wherein the charging state rate control circuit comprises:
   a pulse generator including a first input to receive the output clock signal and a second input to receive the input clock signal, an output of the pulse generator providing an output signal indicative of a delay difference between the input clock signal and the output clock signal;
   a pulse to voltage converter circuit for converting the output signal of the pulse generator to a DC signal indicative of a measured delay between the output clock signal and the input clock signal.

7. The circuit of claim 2 wherein the charging state rate control circuit includes an inverter including a first input for receiving a clock signal, an output coupled to the capacitor, and a second input coupled to a first circuit having an input to receive a signal indicative of a desired delay between the input clock signal and the output clock signal.

8. The circuit of claim 7 further comprising:
   a dual edge detector circuit for providing at its output, pulses at rising edges of the input clock signal and pulses at falling edges of the input clock signal, wherein a frequency of the clock signal received at the input of the inverter is a frequency of an output of the dual edge detector circuit.

9. The circuit of claim 8 further comprising:
   a pulse holding circuit having a first input coupled to the output of the dual edge detector circuit and a second input coupled to an output of the delay control circuit, the output of the pulse holding circuit providing the clock signal to the input of the inverter.

10. The circuit of claim 7 wherein the clock signal received at the first input of the inverter is the input clock signal.

11. The circuit of claim 7 wherein the clock signal received at the first input of the inverter is an inverted version of the input clock signal.

12. The circuit of claim 7 wherein the inverter includes a first transistor, a second transistor, and a third transistor coupled in series, a control terminal of the third transistor is coupled to the output of the first circuit to control its conductivity based on a voltage level of the output of the first circuit, wherein the conductivity of the third transistor controls the charging state rate of the capacitor.

13. The circuit of claim 12 wherein the first circuit includes a second input to receive a signal indicative of a measured delay between the input clock signal and the output clock signal, wherein the output of the charging state rate control circuit adjusts the charging state rate of the capacitor based on a comparison by the first circuit of the input of the first circuit and the second input of the first circuit.

14. The circuit of claim 2 wherein the charging state rate control circuit controls a discharge rate of the capacitor.

15. The clock delay circuit of claim 1 wherein a frequency of the third clock signal is twice the frequency of the input clock signal.

16. The circuit of claim 1 wherein the delay between the input clock signal and output clock signal is programmable by a select signal provided to the delay control circuit.

17. The circuit of claim 1 wherein the delay control circuit further comprises:
   a first capacitor;
   a second capacitor;
   a first charging state rate control circuit, the first charging state rate control circuit controls a charging state rate of the first capacitor, the duty cycle of the third clock signal is dependent upon a charging state rate of the first capacitor;
   a second charging state rate control circuit, the second charging state rate control circuit controls a charging state rate of the second capacitor, the duty cycle of the third clock signal is dependent upon a charging state rate of the second capacitor.

18. The circuit of claim 17 wherein the delay control circuit further comprises:
   a first circuit having a first input to receive the input clock signal and a second input coupled to the first capacitor;
   a second circuit having a first input to receive an inverted version of the input clock signal and a second input coupled to the second capacitor;

a third circuit having a first input to receive an output of the first circuit, a second input to receive an output of the second circuit, and an output to provide the third clock signal.

19. The circuit of claim 1 wherein the latch is a D flip-flop, the first input of the latch is a data input, and the second input of the latch is a clock input.

20. A method for delaying a clock signal comprising:
generating a control signal based on a desired delay between an input clock signal and an output clock signal;
controlling a charging state rate of a capacitor with the control signal;
generating a third clock signal, a duty cycle of the third clock signal is dependent on the charging state rate of the capacitor;
providing the third clock signal to a first input of a latch and the input clock signal to a second input of a latch, wherein an output of the latch provides the output clock signal, wherein a delay between the input clock signal and the output clock signal is dependent upon the duty cycle of the third clock signal.

21. The circuit of claim 1 wherein the delay control circuit includes circuitry to adjust the duty cycle of the third clock signal to adjust the delay between the input clock signal and the output clock signal.

* * * * *